United States Patent [19]
Jacobs et al.

[11] 4,240,196
[45] Dec. 23, 1980

[54] FABRICATION OF TWO-LEVEL POLYSILICON DEVICES

[75] Inventors: Richard M. Jacobs, Allentown, Pa.; Ashok K. Sinha, New Providence, N.J.

[73] Assignee: Bell Telephone Laboratories, Incorporated, Murray Hill, N.J.

[21] Appl. No.: 974,337

[22] Filed: Dec. 29, 1978

[51] Int. Cl.³ .............................................. B01J 17/00
[52] U.S. Cl. ........................................ 29/578; 29/580; 29/591; 156/653; 156/657; 156/662; 357/59
[58] Field of Search ................. 29/571, 578, 580, 591; 156/653, 657, 662; 357/59

[56] References Cited

U.S. PATENT DOCUMENTS 3,551,196  12/1970  Herczog ............................... 156/653
3,906,620   9/1975  Anzai ..................................... 29/578

*Primary Examiner*—W. C. Tupman
*Attorney, Agent, or Firm*—Lucian C. Canepa

[57] ABSTRACT

In a two-level overlapping polysilicon device even the slightest amount of undercutting of an oxide layer (12) which underlies a first polysilicon layer (14) can lead to unacceptably low breakdown voltages in the device. In accordance with the invention, the first polysilicon and oxide layers of an LSI MOS wafer are defined as usual. But then the standard fabrication process is modified to etch the first polysilicon layer back beyond the edge of the oxide undercut. Subsequently, the structure is reoxidized and a second polysilicon layer (22) deposited and patterned. The modified process is characterized by the absence of any oxide thinning between the first and second polysilicon layers or between the second polysilicon layer and the substrate (10) of the device. As a result, voltage breakdown problems in the individual chips of the wafer are thereby greatly reduced and the yield of the wafer significantly increased.

4 Claims, 7 Drawing Figures

FABRICATION OF TWO-LEVEL POLYSILICON DEVICES

BACKGROUND OF THE INVENTION

This invention relates to semiconductor devices and, more particularly, to the fabrication of metal-oxide-semiconductor (MOS) devices.

MOS devices in large-scale-integrated (LSI) form are utilized extensively in a variety of practical applications in the electronics field. In particular, such devices of the two-level overlapping polysilicon electrode type have been recognized by workers in the field as especially advantageous for making random-access-memory (RAM) and charge-coupled-device (CCD) chips in LSI form.

The two-level overlapping polysilicon electrode structure is characterized by a high packing density and an advantageous speed-power product. However, these characteristics are achieved at the expense of a relatively complex processing sequence for making the structure. Furthermore, it has been observed in practice that a major limitation on achieving high yield and reliability in such LSI structures is a high incidence of unacceptably low breakdown voltages therein. This problem occurs due to a breakdown in the oxide that is interposed between the polysilicon layers and/or between the bottom of one of the polysilicon layers and the substrate of the structure.

Accordingly, considerable effort has been directed at trying to devise a processing sequence for LSI MOS devices that would produce structures in which the aforementioned low-voltage-breakdown problem would be eliminated or at least substantially reduced. It was recognized that these efforts if successful could significantly improve the yield and therefore reduce the cost of these commercially important devices.

SUMMARY OF THE INVENTION

Hence, an object of the present invention is an improved process for fabricating reliable LSI MOS devices in a high-yield low-cost way.

Briefly, this and other objects of the present invention are realized in a specific illustrative embodiment thereof that comprises a process for making n-channel LSI MOS devices of the two-layer polysilicon type. Such a device includes a thin oxide layer interposed between the bottom polysilicon layer and the substrate as well as between the polysilicon layers themselves. The inventive process is based on the discovery by applicants that low yield in such a device results from even the slightest amount of undercutting of the thin oxide layer relative to the overlying bottom polysilicon layer. Devices characterized by such undercutting during the initial steps of their fabrication were found subsequently to exhibit severe localized thinning in the oxide layer between the polysilicon layers and/or in the oxide layer between the bottom polysilicon layer and the substrate. In turn, such thinning causes the devices to exhibit unacceptably low breakdown voltages.

In accordance with the principles of the present invention, applicants devised a process that compensated for the aforedescribed undercutting without introducing any undesirable side effects in the fabrication sequence. In accordance with applicants' process, the bottom polysilicon layer and the oxide layer thereunder are defined as usual. Undercutting of the oxide relative to the polysilicon thereby results. Thereafter, in accordance with applicants' process, the already patterned polysilicon layer is further etched. In particular, the polysilicon is selectively etched until it is etched back to or beyond the edge of the underlying oxide undercut. The structure is then reoxidized and, subsequently, the upper polysilicon layer is deposited and patterned. Significantly, this sequence of process steps results in a structure in which the aforedescribed local oxide thinning problem is either eliminated or substantially reduced.

More specifically, applicants' invention comprises a process for making LSI MOS devices of the two-level overlapping polysilicon type. The process includes forming in sequence on the top surface of a silicon substrate a relatively thin oxide layer, a polysilicon layer and a relatively thick oxide layer. The thick oxide layer is patterned. Then the polysilicon layer is patterned using the patterned oxide layer as a mask therefor, whereby undercutting of the polysilicon relative to the thick oxide results. The thick oxide is then etched to insure that no portion thereof overhangs the underlying polysilicon. During this step, exposed portions of the thin oxide, including portions underlying the patterned polysilicon, are removed. Subsequently, the polysilicon is etched to insure that no part thereof overhangs the remaining portions of the thin oxide. Thereafter, in a series of known standard steps, the structure is further processed to form a complete LSI MOS device of the two-level polysilicon type.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

Figure 1:
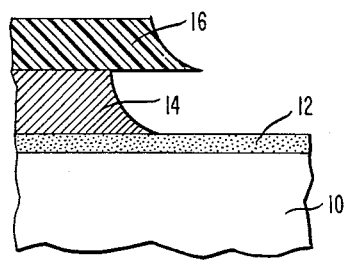
FIGS. 1 and 2 are respective cross-sectional side views of a portion of an LSI MOS structure at different stages in the fabrication sequence thereof.

The layered structure shown in FIG. 1 represents a portion of a specific illustrative LSI MOS device at an intermediate stage of its fabrication. For purposes of a particular illustrative example, the principles of the present invention will be described in the specific context of further processing the depicted structure to form a two-level polysilicon structure (shown in FIG. 5). Subsequently, the applicability of the FIG. 5 structure to forming a RAM device (see FIG. 6) and a CCD device (FIG. 7) will be described.

The specific illustrative layered structure represented in FIG. 1 is known in the LSI MOS field. Such a structure is the basis for making RAM or CCD devices. For purposes of a particular illustrative example, however, the layer thicknesses specified below are those actually employed in the course of making an LSI CCD device. For making RAM devices, the thicknesses of these layers would typically be changed, as is well known in the art.

The structure depicted in FIG. 1 comprises a p-type silicon subtrate 10 having a relatively thin layer 12 of silicon dioxide thereon. Illustratively, the layer 12 is approximately 1000 Angstrom units thick. Overlying the layer 12 is a patterned 7000-Angstrom-thick layer 14 of phosphorus-doped polysilicon. In turn, a patterned 6000-Angstrom-thick layer 16 of silicon dioxide is disposed on top of the layer 14.

The sequence of processing steps customarily utilized to form the structure shown in FIG. 1 results in the oxide layer 16 overhanging the polysilicon layer 14. In practice, the overhanging portion of the layer 16 is removed. If it is not, the overhanging portion or some part thereof may break off during subsequent processing steps (for example, during a cleaning step) and, by becoming lodged in the structure, be the basis for causing a defective device. Removal of the overhanging portion of the silicon dioxide layer 16 is carried out, for example, by subjecting the structure to a standard buffered hydrofluoric acid etching step.

Figure 2:
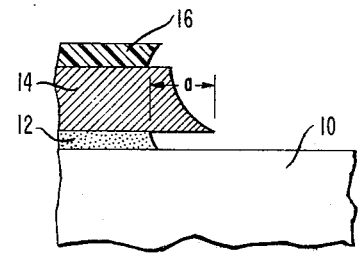

As a result of the specified wet etching step, the portion of the layer 16 that formerly overhung the polysilicon layer 14 is completely removed, as is indicated in FIG. 2. In addition, the thickness of the layer 16 is typically reduced by the etching step to about 3000 Angstroms.

Another result of the aforespecified etching of the layer 16 is that portions of the relatively thin oxide layer 12 are also removed. Exposed or unmasked regions of the layer 12 are completely etched away, thereby exposing surface portions of the substrate 10. Moreover, due to the isotropic nature of the noted wet etching step, portions of the layer 12 that underlie the polysilicon layer 14 are also removed. Undercutting of the layer 14 thereby occurs, as indicated in FIG. 2. In one specific illustrative case, the amount a of this lateral undercut was determined to be approximately 2000 Angstroms.

In accordance with the teachings of the prior art, the structure shown in FIG. 2 is then reoxidized. As a result, a relatively thin layer 18 (FIG. 3) of silicon dioxide is formed on the surface of the substrate 10. At the same time, an oxide layer 20 is formed on the right-hand side of the polysilicon layer 14 and the thickness of the previously formed oxide layer 16 is augmented. Subsequently, in accordance with the prior art, an upper or overlapping polysilicon layer 22 is deposited and patterned in a conventional way, thereby producing the structure schematically depicted in FIG. 3.

Figure 3:
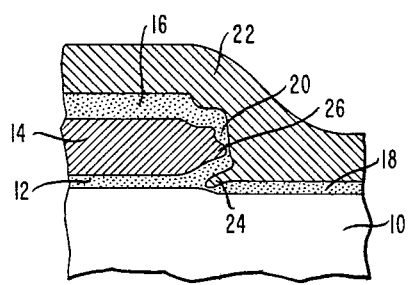
FIG. 3 is a cross-sectional side view of the FIG. 2 structure after being further processed in accordance with a fabrication sequence known in the prior art.

As shown in FIG. 3, the polysilicon layer 22 formed in accordance with known prior art processes typically includes a finger-like projection 24 that extends in close proximity to the substrate 10. (The projection 24 can be considered to extend into a corresponding indented region in the oxide layer.) In addition, the polysilicon layer 14 typically includes one or more projections (such as the projection 26) that lie in close proximity to the polysilicon layer 22. These projections constitute low-voltage-breakdown regions in the depicted structure. In particular, the projection 24 can, and often in practice does, cause the breakdown voltage between the polysilicon layer 22 and the substrate 10 to be lower than specified. Similarly, the projection 26 can cause the breakdown voltage between the polysilicon layers 14 and 22 to be unacceptably low.

In accordance with the prior art, formation of the polysilicon layer 22 shown in FIG. 3 is typically preceded by a wet etching step. In that case, some of the etchant solution may become trapped in the aforespecified indented region of the oxide layer. The indented region may be thereby further extended laterally to the left in FIG. 3. As a result, the distance, and therefore the breakdown voltage, between the subsequently formed polysilicon projection 24 and the substrate 10 may be thereby further reduced.

Applicants discovered that the low-voltage-breakdown regions specified above and represented in FIG. 3 stem from the undercutting phenomenon shown in FIG. 2. Accordingly, by compensating for the undercutting of the oxide layer 12, applicants were thereby able to devise an advantageous fabrication sequence for LSI MOS devices which does not exhibit the low-voltage-breakdown regions shown in the prior art structure of FIG. 3.

In accordance with the principles of applicants' invention, the overhang of the polysilicon layer 14 (FIG. 2) is removed prior to the aforedescribed reoxidation step. This is done by means of any suitable dry or wet etching technique that is capable of removing doped polysilicon but that is relatively ineffective in removing silicon dioxide.

A specific illustrative advantageous etchant for removing the polysilicon overhang shown in FIG. 2 constitutes 10 grams of chrome oxide added to one liter of a 25:1 mixture of water and hydrofluoric acid. Other suitable etchants for removing the polysilicon overhang are available. These include a standard mixture of nitric, hydrofluoric and acetic acids, a plasma containing $CF_3Cl$, or a plasma containing a mixture of chlorine and hexafluoroethane as described for example, in a copending commonly assigned application of W. R. Harshbarger, H. J. Levinstein, C. J. Mogab and R. A Porter, application Ser. No. 929,549, filed July 31, 1978, entitled "Device Fabrication by Plasma Etching".

Figure 4:
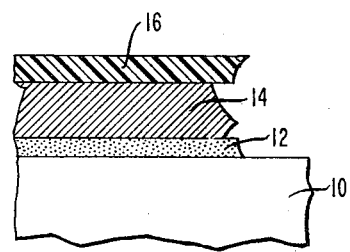
FIGS. 4 and 5 are respective cross-sectional side views of the FIG. 2 structure after being further processed in accordance with the principles of the present invention.

In accordance with the present invention, the right-hand edge of the polysilicon layer 14 shown in FIG. 2 is selectively etched back to lie approximately in line with or to the left of the right-hand edge of the underlying oxide layer 12. The resulting structure, shown in FIG. 4, is characterized by no undercutting of the oxide layer 12 relative to the polysilicon layer 14. Accordingly, during subsequent fabrication steps, no localized oxide thinning and low-voltage-breakdown regions attributable to the undercutting phenomenon ar formed in the structure being fabricated.

In practice, the overhang of the layer 16 relative to the layer 14 of FIG. 4 is slight relative to the overhang depicted in FIG. 1. Moreover, the fabrication sequence employed to further process the FIG. 4 arrangement does not typically include a cleaning step prior to reoxidizing the depicted structure. Accordingly, in contrast to the situation described above in connection with FIG. 1, the likelihood of the relatively small overhang of FIG. 4 causing a defect in the completed device is, as a practical matter, nonexistent or at the worst exceedingly small.

Figure 5:
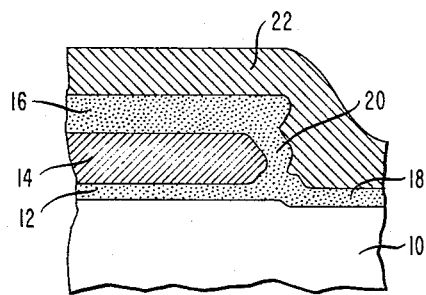

FIG. 5 shows the FIG. 4 structure at a subsequent point in the device fabrication sequence. As in the previously described FIG. 3 structure, an overlapping upper polysilicon layer 22 is shown in FIG. 5 separated from a lower polysilicon layer 14 by a layer of silicon dioxide. The oxide layer is also interposed between the polysilicon layers 14 and 22 and the substrate 10. Significantly, the geometry of the resulting structure is consistently such that virtually no localized oxide thinning and hence no unacceptably low voltage breakdown regions exist therein. In practice, the breakdown voltages measured between the layers 14 and 22 of the FIG. 5 structure and between the layer 22 and the substrate 10 thereof were found to be appreciably greater than the corresponding voltages measured in the FIG. 3 structure.

In one specific illustrative case in which a particular CCD device was fabricated in LSI MOS form by prior art techniques, the median breakdown voltages measured between the polysilicon layers 14 and 22 and between the layer 22 and the substrate 10 of the FIG. 3 structure were 60 and 35 volts, respectively. The corresponding values of the minimum thicknesses of the intervening oxide between the polysilicon layers 14 and 22 and between the layer 22 and the substrate 10 were 900 Angstroms and 450 Angstroms, respectively. In the same illustrative device made in accordance with a fabrication sequence modified as specified herein in accordance with applicants' invention, which thereby produced the structure shown in FIG. 5, the minimum thicknesses of the intervening oxide measured between the polysilicon layers 14 and 22 and between the layer 22 and the substrate 10 were 1100 Angstroms and 900 Angstroms, respectively; and the corresponding values of median breakdown voltages were 73 volts and 80 volts, respectively.

The two-level overlapping polysilicon structure shown in FIG. 5 is, for example, the basis for fabricating advantageous LSI MOS random-access-memory and charge-coupled devices. Schematic representations of portions of such devices are respectively depicted in FIGS. 6 and 7. In each of FIGS. 6 and 7, the region between reference lines 5 includes the aforedescribed basic structure shown in FIG. 5.

Figure 6:
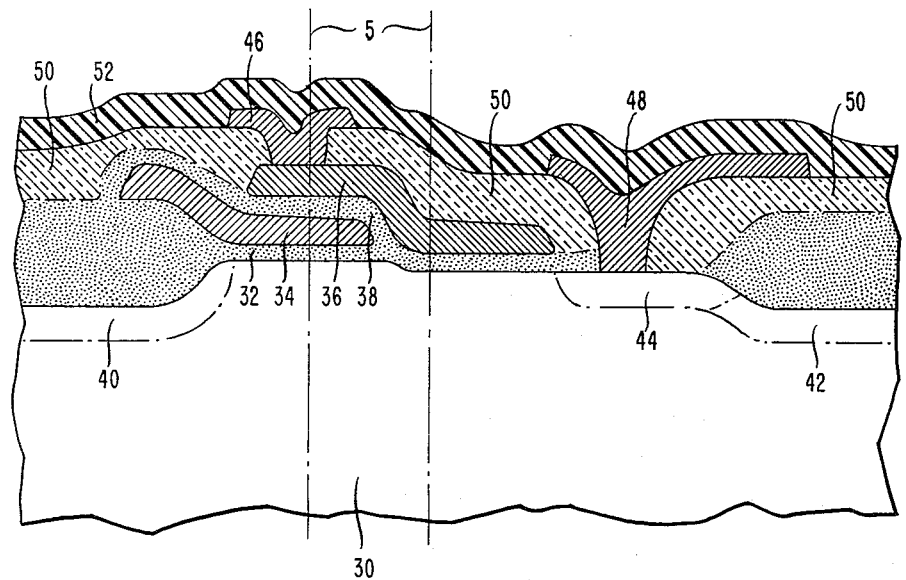
FIG. 6 is a cross-sectional side view of a portion of an LSI MOS random-access-memory device that includes a structural arrangement of the type depicted in FIG. 5.

In the RAM device represented in FIG. 6, the region between the reference lines 5 includes a substrate 30, a gate oxide layer 32 and a doped polysilicon element 34. These correspond, respectively, to the substrate 10, oxide layer 12 and polysilicon layer 14 shown in FIG. 5. In addition, the indicated region of FIG. 6 also comprises an overlapping doped polysilicon element 36 and a silicon dioxide layer 38 interposed between the elements 34 and 36. These correspond, respectively, to the polysilicon layer 22 and the oxide regions 16, 18, 20 shown in FIG. 5.

A typical memory device of the type depicted in FIG. 6 includes additional standard layers and regions known in the LSI MOS art. Some of these are schematically represented in FIG. 6. They include conventional chanstop regions 40 and 42, a drain region 44, conductive contacts 46 and 48 made, for example, of aluminum, a layer 50 of phosphorus glass and a passivating layer 52 of silicon nitride.

Figure 7:
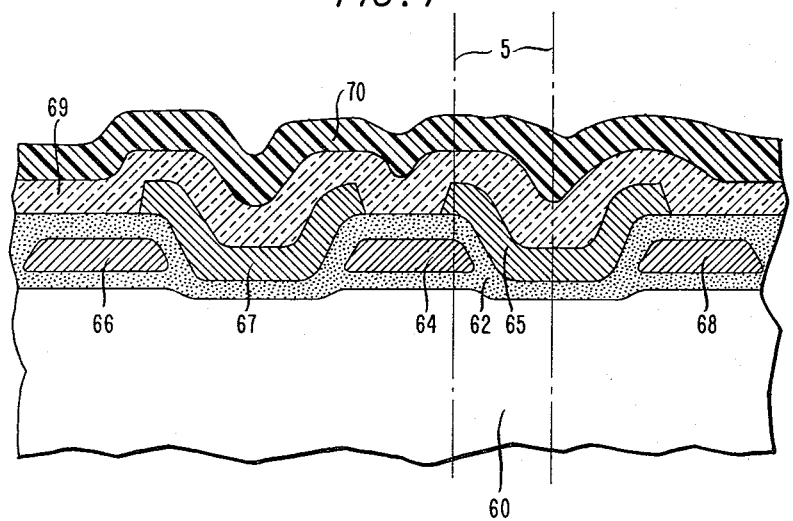
FIG. 7 is a cross-sectional side view of a portion of an LSI MOS charge-coupled device that includes a structural arrangement of the type shown in FIG. 5.

In the CCD device represented in FIG. 7, the region between the reference lines 5 includes a substrate 60, a silicon dioxide portion 62 and doped overlapping polysilicon electrodes 64 and 65. The correspondence between this part of the indicated region of FIG. 7 and the FIG. 5 structure is apparent.

A typical CCD device of the type depicted in FIG. 7 includes additional standard layers and regions known in the LSI MOS art. Some of these are schematically represented in FIG. 7. They include conventional additional doped polysilicon electrodes 66 through 68, a phosphorus glass layer 69 and a layer 70 made of silicon nitride.

Finally, it is to be understood that the above-described techniques and structures are only illustrative of the principles of the present invention. In accordance with those principles, numerous modifications and alternatives may be devised by those skilled in the art without departing from the spirit and scope of the invention.

We claim:

1. A method of fabricating an LSI MOS device comprising the steps of
   forming a structure that comprises, in order, on a silicon substrate (10): a relatively thin layer of silicon dioxide (12), a patterned layer (14) of doped polysilicon and a patterned relatively thick layer (16) of silicon dioxide, wherein portions of the relatively thick layer of oxide overhang portions of the polysilicon layer, at least part of each of said layers constituting a permanent constituent portion of said LSI MOS device to be fabricated,
   etching the relatively thick oxide layer to remove said overhanging portions, whereby, at the same time, portions of said relatively thin layer under said polysilicon layer are undercut relative to said polysilicon layer to cause portions of said polysilicon layer to overhang said relatively thin layer,
   CHARACTERIZED IN THAT said method comprises the additional steps of
   etching said polysilicon layer (14) to remove the overhanging portions thereof,
   oxidizing said etched structure to cover all exposed surface portions of said polysilicon layer and said substrate with a layer of silicon dioxide,
   and forming another patterned layer (22) of doped polysilicon in overlapping spaced-apart relationship with respect to said first-mentioned layer (14) of polysilicon to form a two-level polysilicon structure.

2. A method as in claim 1 comprising the still additional steps of
   forming an insulating layer on said two-level polysilicon structure,
   establishing electrical connections to selected portions of said structure by forming contact openings in said insulating layer and forming a conductive pattern on said insulating layer and in said openings,
   and forming a passivating layer over said insulating layer and said conductive pattern.

3. A method as in claim 2 wherein said second-mentioned etching step comprises wet etching with 10 grams of chrome oxide added to one liter of a 25:1 mixture of water and hydrofluoric acid.

4. In a process for making LSI MOS devices for the two-level overlapping polysilicon type, a fabrication sequence that includes the following method steps:
   forming in sequence on the top surface of a silicon substrate a relatively thin silicon dioxide layer, a polysilicon layer and a relatively thick layer of silicon dioxide, at least part of each of said layers constituting a permanent constituent portion of each of said LSI MOS devices to be fabricated,
   patterning the relatively thick silicon dioxide layer,
   patterning the polysilicon layer using the patterned silicon dioxide layer as a mask, etching the relatively thick silicon dioxide layer to insure that no portion thereof overhangs the underlying polysilicon layer, whereby at the same time exposed portions of the relatively thin silicon dioxide layer including portions underlying the patterned polysilicon layer are removed, etching the polysilicon layer to insure that no portion thereof overhangs the remaining portions of the relatively thin silicon dioxide layer, oxidizing all exposed surface portions of said polysilicon layer and said silicon substrate to cover said portions with a layer of silicon dioxide, and forming another patterned layer of polysilicon on said last-mentioned layer of silicon dioxide.

* * * * *